(12) United States Patent
Liu et al.

(10) Patent No.: US 10,797,223 B2
(45) Date of Patent: Oct. 6, 2020

(54) INTEGRATED CIRCUITS WITH MAGNETIC RANDOM ACCESS MEMORY (MRAM) DEVICES AND METHODS FOR FABRICATING SUCH DEVICES

(71) Applicant: Globalfoundries Singapore Pte. Ltd., Singapore (SG)

(72) Inventors: Bin Liu, Singapore (SG); Eng Huat Toh, Singapore (SG); Yinjie Ding, Singapore (SG); Kangho Lee, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 80 days.

(21) Appl. No.: 15/882,362

(22) Filed: Jan. 29, 2018

(65) Prior Publication Data
US 2019/0237658 A1    Aug. 1, 2019

(51) Int. Cl.
*H01L 43/02* (2006.01)
*G11C 11/16* (2006.01)
(Continued)

(52) U.S. Cl.
CPC ............ *H01L 43/02* (2013.01); *G11C 11/161* (2013.01); *H01L 27/228* (2013.01); *H01L 29/785* (2013.01); *H01L 43/12* (2013.01)

(58) Field of Classification Search
CPC ....... H01L 43/02; H01L 43/12; H01L 29/785; H01L 27/228; H01L 27/0207; H01L 27/11; H01L 27/1104; H01L 29/41791; H01L 27/0924; H01L 21/823821; H01L 21/823871; H01L 27/1108;
(Continued)

(56) References Cited

U.S. PATENT DOCUMENTS 8,067,808 B2   11/2011   Kakoschke et al.
8,848,423 B2    9/2014   Chung
(Continued)

OTHER PUBLICATIONS

German Patent and Trademark Office, Official Action received in Patent Application No. 10 2019 200 916.6 dated Aug. 6, 2020.

*Primary Examiner* — Mouloucoulaye Inoussa
(74) *Attorney, Agent, or Firm* — Thompson Hine LLP (57) ABSTRACT

Integrated circuits with magnetic random access memory (MRAM) devices and methods for fabricating such devices are provided. In an exemplary embodiment, a method for fabricating MRAM bitcells includes determining a desired inter-cell spacing between a first bitcell and a second bitcell and double patterning a semiconductor substrate to form semiconductor fin structures, wherein the semiconductor fin structures are formed in groups with an intra-group pitch between grouped semiconductor fin structures and with the inter-cell spacing between adjacent groups of semiconductor fin structures different from the intra-group pitch. The method further includes forming a first MRAM memory structure over the semiconductor fin structures in the first bitcell and forming a second MRAM memory structure over the semiconductor fin structures in the second bitcell. Also, the method includes forming a first source line for the first bitcell between the first MRAM memory structure and the second MRAM memory structure.

6 Claims, 8 Drawing Sheets

(51) Int. Cl.
*H01L 27/22* (2006.01)
*H01L 29/78* (2006.01)
*H01L 43/12* (2006.01)

(58) Field of Classification Search
CPC ......... H01L 21/823431; H01L 27/0886; H01L 29/66545; H01L 21/823814; H01L 29/7851; H01L 29/66795; H01L 29/66803; G11C 11/161
USPC .................. 257/368, 390, E27.098, E27.099
See application file for complete search history.

(56) References Cited

U.S. PATENT DOCUMENTS

| | | | |
|---|---|---|---|
| 9,012,995 B2 | 4/2015 | Kakoschke et al. | |
| 2008/0310213 A1 | 12/2008 | Chen et al. | |
| 2011/0133285 A1* | 6/2011 | Liaw | H01L 27/0207 |
| | | | 257/368 |
| 2016/0172359 A1* | 6/2016 | Yoon | H01L 27/0886 |
| | | | 257/401 |
| 2017/0092745 A1 | 3/2017 | Cheng et al. | |
| 2017/0194378 A1 | 7/2017 | Kim | |
| 2018/0342669 A1* | 11/2018 | Kim | G11C 11/161 |
| 2019/0148625 A1* | 5/2019 | Tseng | H01L 43/08 |
| | | | 365/158 |

* cited by examiner

INTEGRATED CIRCUITS WITH MAGNETIC RANDOM ACCESS MEMORY (MRAM) DEVICES AND METHODS FOR FABRICATING SUCH DEVICES

TECHNICAL FIELD

The technical field generally relates to sophisticated semiconductor devices and the manufacturing of such devices, and, more specifically, to a non-volatile memory (NVM) device, such as a magnetic random access memory (MRAM) device, formed with semiconductor fin structures.

BACKGROUND

As is well known to those skilled in the art, non-volatile memory devices are characterized in that there is no loss of data stored in their memory cells, even when an external power supply is removed. For that reason, such non-volatile memory devices are widely employed in computers, mobile communication systems, memory cards and the like.

In contrast to conventional planar metal-oxide-semiconductor field-effect transistors ("MOSFETs"), multi-gate transistors incorporate two or more gates into a single device. Relative to single gate transistors, multi-gate transistors reduce off-state current leakage, increase on-state current flow, and reduce overall power consumption. Multi-gate devices having non-planar topographies also tend to be more compact than conventional planar transistors and consequently permit higher device densities to be achieved.

One known type of non-planar, multi-gate transistor, commonly referred to as a "FinFET," includes two or more parallel fins ("fin structures") formed on a substrate. The fin structures extend along a first axis between common source and drain electrodes. At least one conductive gate structure is formed over the fin structures and extends along a second axis generally perpendicular to the first axis. More specifically, the gate extends across and over the fin structures such that an intermediate region of the gate conformally overlays three surfaces of each fin (i.e., an upper surface, a first sidewall surface, and a second opposing sidewall surface of each fin). The surfaces form the channel of the gate.

While providing the advantages noted above, FinFETs and other non-planar multi-gate devices (e.g., triFETs) can be somewhat difficult to integrate with fabrication of semiconductor devices such as MRAM devices.

Accordingly, it is desirable to provide methods for fabricating integrated circuits including MRAM devices formed over FinFETs. Also, it is desirable to provide methods for fabricating integrated circuits with semiconductor fin structures wherein the methods do not necessitate a fin cut step to removed unwanted fin structures. It is also desirable to provide integrated circuits having improved design of MRAM devices and semiconductor fin structures. Furthermore, other desirable features and characteristics will become apparent from the subsequent detailed description and the appended claims, taken in conjunction with the accompanying drawings and the foregoing technical field and background.

BRIEF SUMMARY

Integrated circuits with magnetic random access memory (MRAM) devices and methods for fabricating such devices are provided. In an exemplary embodiment, a method for fabricating MRAM bitcells includes determining a desired inter-cell spacing between a first bitcell and a second bitcell and double patterning a semiconductor substrate to form semiconductor fin structures, wherein the semiconductor fin structures are formed in groups with an intra-group pitch between grouped semiconductor fin structures and with the inter-cell spacing between adjacent groups of semiconductor fin structures different from the intra-group pitch. The method further includes forming a first MRAM memory structure over the semiconductor fin structures in the first bitcell and forming a second MRAM memory structure over the semiconductor fin structures in the second bitcell. Also, the method includes forming a first source line for the first bitcell between the first MRAM memory structure and the second MRAM memory structure.

In another embodiment, a method for fabricating an integrated circuit includes patterning a semiconductor substrate to form semiconductor fin structures, wherein the semiconductor fin structures are formed in groups with an intra-group pitch between grouped semiconductor fin structures and with an inter-group pitch between adjacent groups of semiconductor fin structures, wherein the inter-group pitch is greater than the intra-group pitch. Further, the method includes performing an epitaxial deposition process to form epitaxial semiconductor material over the semiconductor fin structures, wherein the epitaxial semiconductor material is merged over each group of semiconductor fin structures, and wherein the epitaxial semiconductor material is unmerged between adjacent groups of semiconductor fin structures. Also, the method includes forming a magnetic tunnel junction (MTJ) structure over the epitaxial semiconductor material merged over each group of semiconductor fin structures.

In yet another exemplary embodiment, an integrated circuit is provided. The exemplary integrated circuit includes a first bitcell including a first group of semiconductor fin structures and a first MRAM memory structure over the first group of semiconductor fin structures. Further, the integrated circuit includes a second bitcell including a second group of semiconductor fin structures and a second MRAM memory structure over the second group of semiconductor fin structures. Also, the integrated circuit includes a first source line for the first bitcell between the first MRAM memory structure and the second MRAM memory structure.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

Embodiments of integrated circuits with magnetic random access memory (MRAM) devices and methods for fabricating such devices will hereinafter be described in conjunction with the following drawing figures, wherein like numerals denote like elements, and wherein.

DETAILED DESCRIPTION

The following detailed description is merely exemplary in nature and is not intended to limit the magnetic random access memory (MRAM) devices and methods for fabricating such devices described herein. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various processes in the fabrication memory devices are well-known and so, in the interest of brevity, many conventional processes will only be mentioned briefly herein or will be omitted entirely without providing the well-known process details. Further, it is noted that transistors and MRAM devices include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "under", "lower", "higher" and the like, may be used herein for ease of description to describe one element or feature's relationship to another element(s) or feature(s) as illustrated in the figures. It will be understood that the spatially relative terms are intended to encompass different orientations of the device in use or operation n addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

FIGS. 1-6 illustrate processing in accordance with various embodiments of methods for fabricating integrated circuits. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
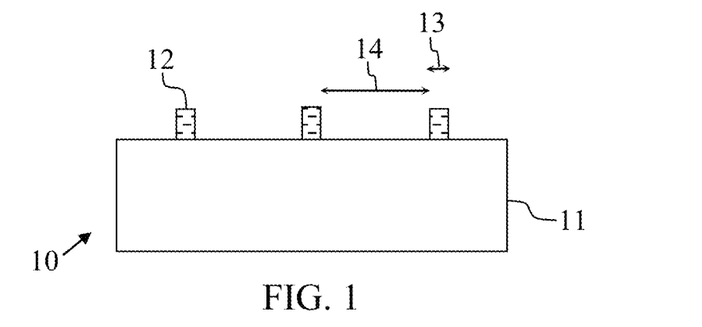
FIGS. 1-4 illustrate, in cross section, a portion of an integrated circuit and method steps for fabricating semiconductor fin structures for an integrated circuit in accordance with various embodiments herein.

In FIG. 1, in an exemplary embodiment, the method for fabricating an integrated circuit 10 begins by providing a semiconductor substrate 11. The semiconductor substrate 11 is preferably a silicon substrate (the term "silicon substrate" encompassing the relatively pure silicon materials typically used in the semiconductor industry as well as silicon admixed with other elements, such as germanium and the like). Semiconductor substrate 11 can be a bulk silicon wafer.

As shown in FIG. 1, in an exemplary embodiment, an optional capping layer or layers may be formed overlying the semiconductor substrate 11. As used herein, the term "overlying" encompasses "on" and "over" and is used to describe the orientation and/or location of a feature or element within the consistent but arbitrary frame of reference illustrated by the drawings. In one embodiment, the capping layer is formed directly on the semiconductor substrate 11. In another embodiment, the capping layer is formed over the semiconductor substrate such that an intermediate layer is formed between the capping layer and the semiconductor substrate.

A mandrel layer is also formed overlying the semiconductor substrate 11 and is patterned to form sacrificial mandrel structures 12. The mandrel layer may be deposited utilizing a known deposition technique, such as chemical vapor deposition. A non-exhaustive list of materials that can be deposited to form the mandrel layer includes polycrystalline silicon, silicon oxynitride, silicon oxide, and silicon nitride. While no capping layer is illustrated between the mandrel layer and the semiconductor substrate 11, it is contemplated that one or more than one capping layer be formed between mandrel layer and semiconductor substrate 11.

The mandrel layer may be patterned using a photolithography process according to well-known process steps. In an exemplary embodiment, the sacrificial mandrel structures 12 have uniform widths and are uniformly spaced from one another. Further, the sacrificial mandrel structures 12 are not spaced from one another by a distance equal to the mandrel width. Rather, the distance between sacrificial mandrel structures 12 is selected and controlled to provide the desired memory structures as described below. In an exemplary embodiment, each sacrificial mandrel structure 12 has a width 13 and the sacrificial mandrel structures 12 are formed with a uniform spacing 14. Exemplary dimensions of width 13 and spacing 14 could be 34 nanometers (nm) and 92 nm, respectively, but other larger or smaller dimensions are also possible.

Figure 2:
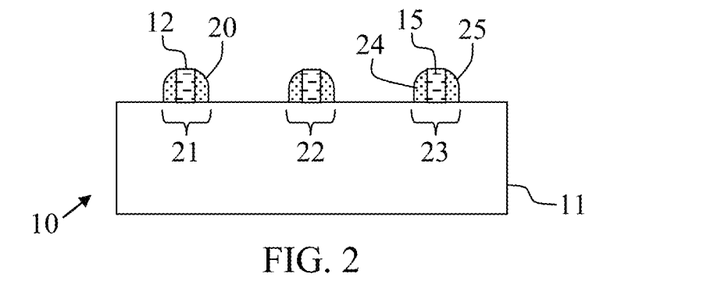

In FIG. 2, in an exemplary embodiment, a spacer-forming layer is deposited over the sacrificial mandrel structures 12 and is etched to form spacers 20. The spacer-forming layer may be formed via the blanket deposition of silicon nitride, silicon oxide, or another dielectric material. In an embodiment, the spacer-forming layer is masked and an anisotropic or directional etch is performed to remove selected regions of spacer-forming layer and to create spacers 20 adjacent opposing sides of each sacrificial mandrel structure 12. Spacers 20 formed around a same sacrificial mandrel structure 12 may be considered to be within a same group 21, 22 or 23 of spacers 20. For example, spacers 24 and 25 are formed around spacer 15 and are within group 23 of spacers 20. Thus, spacers 24 and 25 are grouped. While the illustrated groups 21, 22 and 23 each include two spacers (for forming two fins of one cell) the number of spacers (and fins) is not necessarily two, but may be any suitable number equal to or greater than two.

Figure 3:
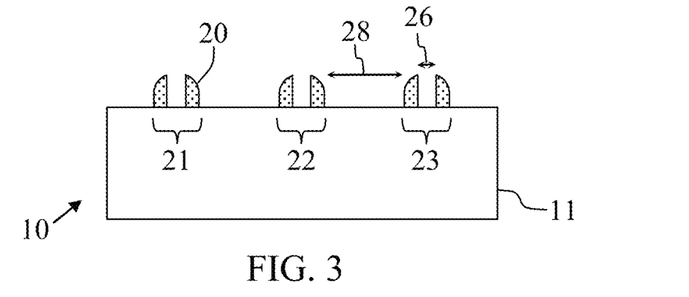

In FIG. 3, the sacrificial mandrel structures 12 are removed by an etch process in accordance with an embodiment. For example, a dry etch selective to the sacrificial mandrel structures 12, such as a reactive ion etch, may be performed. Alternatively, a hot phosphoric acid wet etch may be used. As a result, the spacers 20 are formed with an intra-group distance 26 between spacers 20 within a group 21, 22 or 23, and with inter-group distance 28 between adjacent groups 21 and 22 or 22 and 23 of spacers 20. Intra-group distance 26 is substantially equal to the width (W) 13 of a sacrificial mandrel structure 12 (26=W) and inter-group distance 28 is equal to the difference between the distance (D) 14 between sacrificial mandrel structure 12 and the widths (W) 13 of two sacrificial mandrel structures 12 (28=D−2W).

Figure 4:
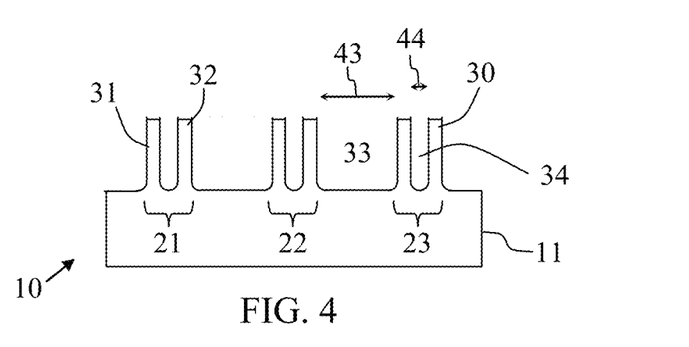

In FIG. 4, an anisotropic etch is performed to etch the semiconductor substrate 11 (and capping layer, if utilized) into fin structures 30 and spacers 20 are removed. Specifically, a wet etch is performed with an appropriate etchant chemistry that etches the semiconductor substrate 11 and overlying layers to form large recesses 33 and narrow recesses 34 between fin structures 30. As used herein, the phrase "fin structures" refers in general to raised, non-planar, three dimensional structures as used in the art and are not limited to a particular shape or topography.

As a result of the process described above, the integrated circuit 10 includes fin structures 30 of uniform height and uniform width, and which are distanced from one another by two uniform distances, width 43 of the larger recesses 33 and width 44 of the narrower recesses 34. Width 43 is substantially equal to inter-group distance 28 and width 44 is substantially equal to intra-group distance 26.

Further, fins may be considered to be formed in groups 21, 22 and 23 analogous to the groups of spacers 20 above. For example fins 31 and 32 are within group 21 of fins 30. Thus, fins 31 and 32 are grouped.

Figure 5:
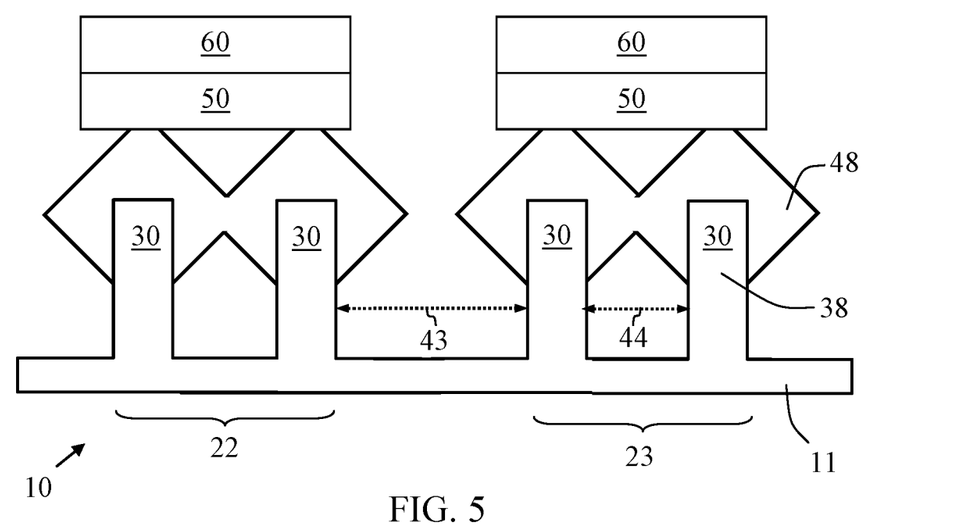
FIGS. 5-6 illustrate, in cross section, a portion of an integrated circuit and method steps for fabricating MRAM devices over the semiconductor fin structures of FIG. 4 for an integrated circuit in accordance with various embodiments herein.
Figure 6:
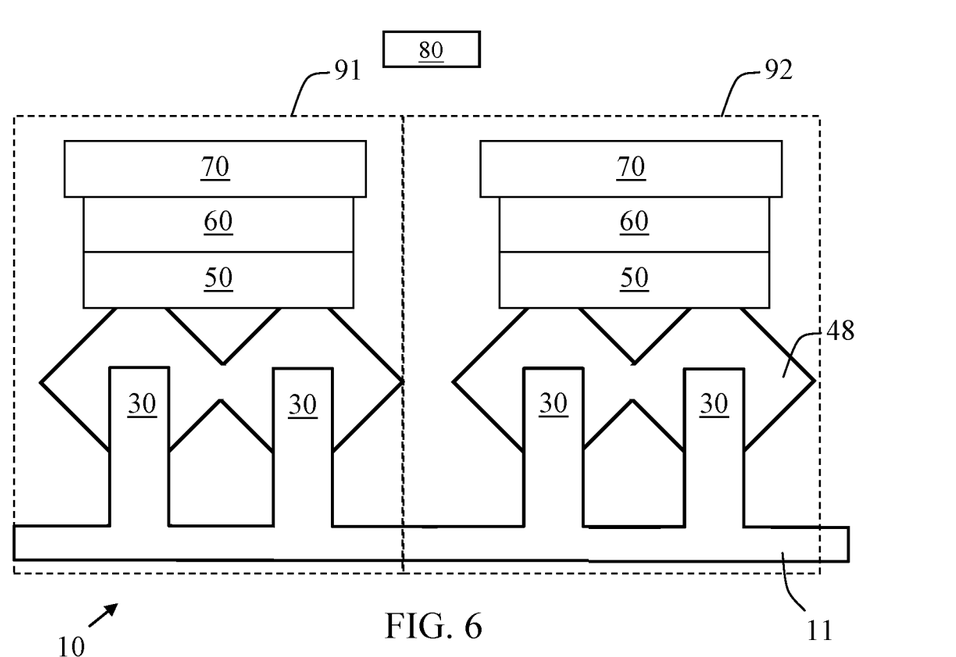

In FIGS. 5 and 6, the method continues with the formation of a magnetic storage unit, such as a magnetic tunnel junction (MTJ), and lines for the formation of a magnetic random access memory (MRAM) bitcell. As is well-known in FinFET processing, a gates (not shown) may be built over fins 30 to divide the fins into source, drain, and body regions. Typically, the channel region can be extended into the body because the fins are so thin such that the body is almost depleted.

FIG. 5 provides a cross-sectional view through source/drain regions 38 of fins 30. As shown, the source/drain regions 38 of the fins 30 can be coupled together by constructing extended source/drain regions 48. Typically, the extended source/drain regions 48 are built over field oxide (not shown) after the fins and gates are fabricated, and therefore, are thermally isolated from the substrate 11.

In FIG. 5, the extended source/drain regions 48 are fabricated by depositing or growing polysilicon, polycrystalline Si/SiGe, lateral epitaxial silicon/SiGe, or Selective Epitaxial Growth (SEG), or the like over the source/drain regions 38. The extended source/drain 48 can be a diamond shape with facets and rise above the fin height.

As shown, the extended source/drain regions 48 merge above the fins 30 within group 22 and above the fins 30 within the group 23. However, due to the greater distance 43 between groups 22 and 23 of fins 30, the extended source/drain regions 48 do not merge between the adjacent groups 22 and 23 of fins 30, thus, isolation is provided between neighboring bits.

In FIG. 5, an interconnect 50 is formed over the extended source/drain regions 48. It is noted that interconnect 50 may be formed directly on extended source/drain regions 48. However, in exemplary embodiments multiple layers of metal (not shown) may be formed between the extended source/drain regions 48 and the interconnect 50.

Interconnects 50 connect various components of the integrated circuit to perform desired functions. Exemplary interconnects include contacts and conductive or metal lines that are formed through various dielectric layers, such as interlayer dielectrics (not shown) to be coupled to other interconnects and devices for forming the integrated circuit 10. The interconnect 50 may be formed of a metal, such as copper, copper alloy, aluminum, tungsten or a combination thereof. Other suitable types of metal, alloys or conductive materials may also be useful. In some cases, the conductors and contacts may be formed of the same material. In some cases, the conductors and contacts may have different materials.

As shown in FIG. 5, a storage unit 60 of a memory cell is disposed over the interconnect 50 in a storage dielectric layer (not shown). Each storage unit 60 includes a storage element disposed between bottom and top electrodes, forming a (perpendicular) magnetic tunnel junction (pMTJ) element. While not illustrated, the storage unit 60 may include the various layers typical of an MTJ structure, including for example, a bottom electrode, wetting layer, seed, layer, antiparallel layers, antiferromagnetic layer, coupling layer, spacer layer, magnetically fixed or reference layer, tunnel barrier layer, magnetically free or storage layer, capping layer and top electrode In one embodiment, the bottom electrode of the storage unit 60 is coupled to a drain region 38 of a select transistor formed in fin 30. Other configurations of coupling the bottom electrode may also be useful.

In FIG. 6, a bitline BL 70 is formed over and coupled to the top electrode of the storage unit 60. The bitline 70 extends along a bitline direction parallel to the fins 30 (perpendicular to the plane of the drawing sheet). The source region of the transistor formed in the fin 30 may be coupled to a source line SL (not shown in FIGS. 4-5) that extends parallel to the bitline 70. Further, the gate (not shown) of the transistor formed in the fin 30 may be coupled to a wordline WL (not shown).

Figure 7:
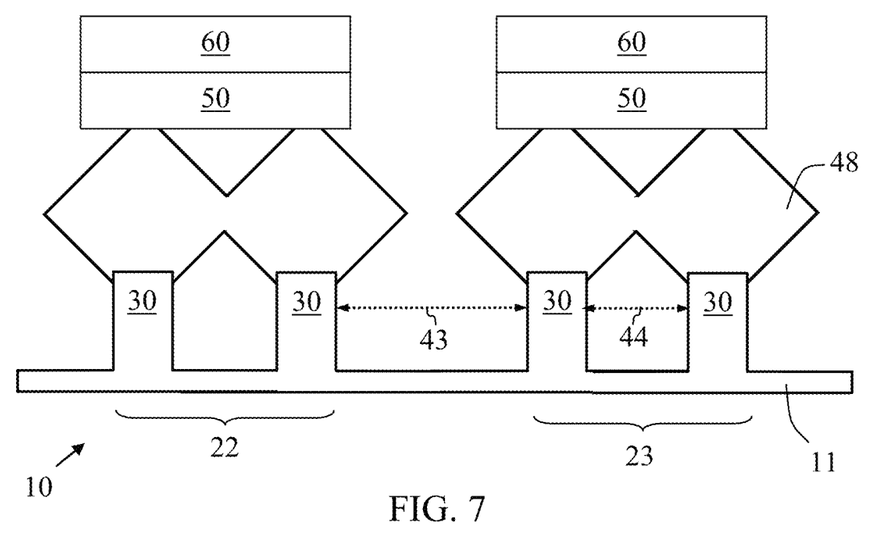
FIGS. 7-8 illustrate, in cross section, a portion of an integrated circuit and method steps for fabricating MRAM devices over the semiconductor fin structures of FIG. 4 for an integrated circuit in accordance with another embodiment herein.
Figure 8:
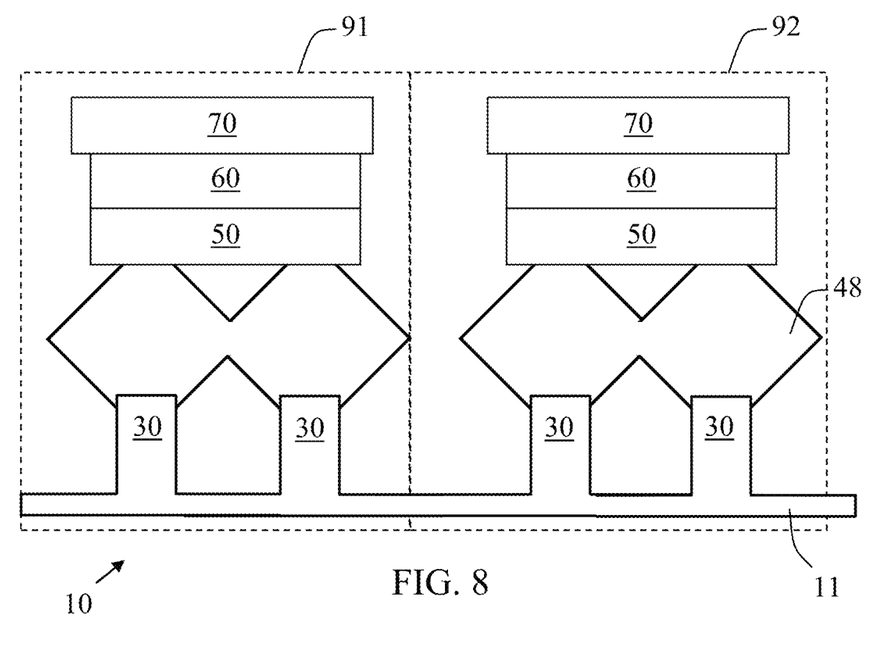

FIGS. 7-8 show an exemplary embodiment in which fins 30 were recess etched before formation of extended source/drain regions 48, such as by source/drain SEG.

Figure 9:
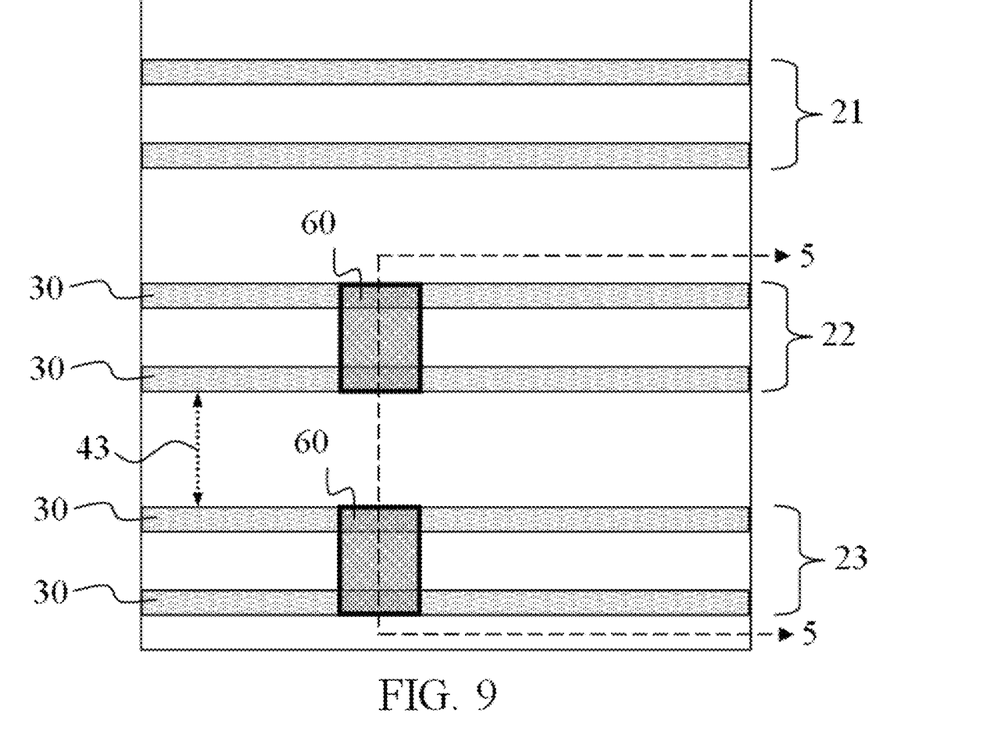
FIGS. 9-10 are top views of the portion of an integrated circuit of FIGS. 5-6, respectively illustrating the formation and location of bitlines, source lines and word lines in accordance with an embodiment herein.
Figure 10:
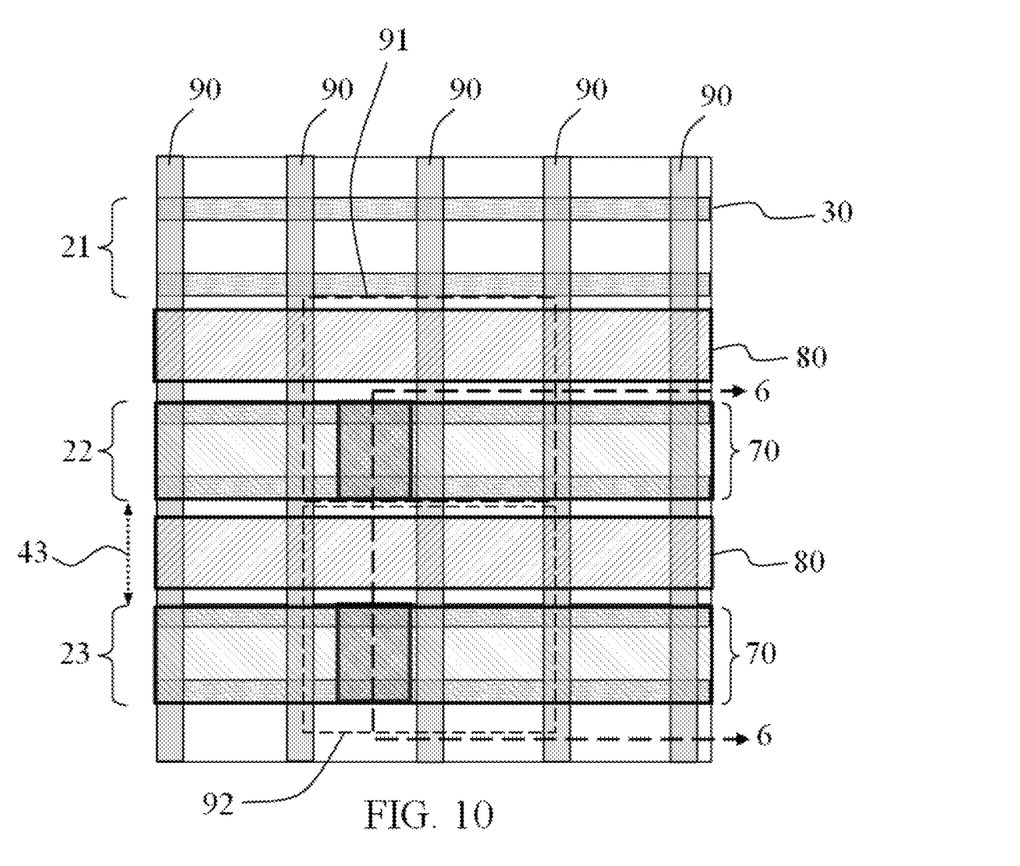

Referring to FIGS. 9-10, the spacing and direction of fins 30, storage units 60, bitlines 70, source lines 80 and word lines 90 are illustrated. FIG. 9 provides a top view of the partially fabricated integrated circuit 10 of FIG. 5, such that FIG. 5 is taken along line 5-5 in FIG. 9. As shown, each storage unit 60 is formed over each group 22 and 23 of fins 30 that are separated from one another by distance 43.

FIG. 10 provides a top view of the partially fabricated integrated circuit 10 of FIG. 6, such that FIG. 6 is taken along line 6-6 in FIG. 10. As shown, a bitline 70 is formed over each storage unit 60 and extends in the same direction as fins 30.

Further, FIG. 10 illustrates the source line 80 parallel to the bitline 70. In certain embodiments, the source line 80 may be connected to the source of transistors formed by fins 30. Also, FIG. 10 illustrates wordlines WL 90. Each wordline 90 extends along a wordline direction perpendicular to the bitline 70 and source line 80.

Cross-referencing FIGS. 9 and 10, it may be seen that each group 22 and 23 of fins 30, and the associated storage units 60 are formed within a memory cell 91 and 92. In FIG. 10, it can be seen that the larger distance 43 between the groups 22 and 23 of fins 30 provides space for inclusion of the source line 80. For example, the source line 80 may be placed at the same level as, and in between, the interconnects 50 shown in FIGS. 5 and 6.

Figure 11:
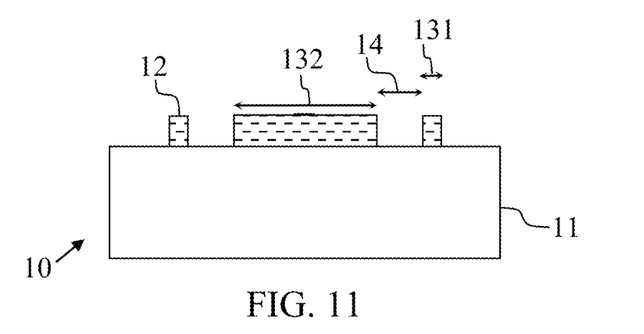
FIGS. 11-12 and 13-14 illustrate, in cross section, a portion of an integrated circuit and method steps for fabricating semiconductor fin structures for an integrated circuit in accordance with other various embodiments herein.
Figure 12:
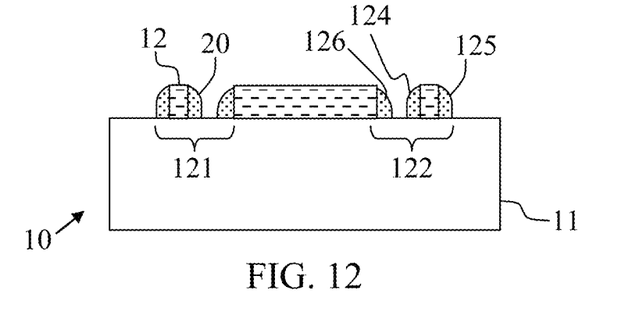

FIGS. 11-12 illustrate the method for fabricating an integrated circuit 10 utilizing a different layout of sacrificial mandrel structures 12. The processing in FIGS. 11-12 is identical to that of FIGS. 1-2 but performed with a different layout. In FIG. 11, the sacrificial mandrel structures 12 do not have uniform widths but are uniformly spaced from one another. Further, the sacrificial mandrel structures 12 are not spaced from one another by a distance equal to the mandrel widths. Rather, the mandrel widths and distance between sacrificial mandrel structures 12 is selected and controlled to provide the desired memory structures as described below. In an exemplary embodiment, the sacrificial mandrel structures 12 have a width 131 or 132 and the sacrificial mandrel structures 12 are formed with a uniform spacing 14.

In FIG. 12, in an exemplary embodiment, a spacer-forming layer is deposited over the sacrificial mandrel structures 12 and is etched to form spacers 20. The spacer-forming layer may be formed via the blanket deposition of silicon nitride, silicon oxide, or another dielectric material. In an embodiment, the spacer-forming layer is masked and an anisotropic or directional etch is performed to remove selected regions of spacer-forming layer and to create spacers 20 adjacent opposing sides of each sacrificial mandrel structure 12. Spacers 20 are formed within groups 121 or 122 of spacers 20. For example, spacers 124, 125 and 126 are formed nearest one another and within group 122 of spacers 20. Thus, spacers 124, 125 and 126 are grouped. The illustrated groups 121 and 122 each include three spacers (for forming three fins of one cell).

Processing of the partially fabricating integrated circuit 10 of FIG. 12 may continue as described in FIGS. 3-6 above.

Figure 13:
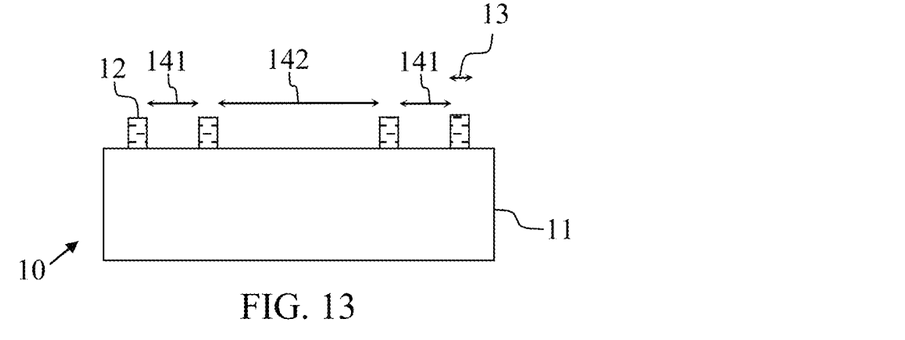
Figure 14:
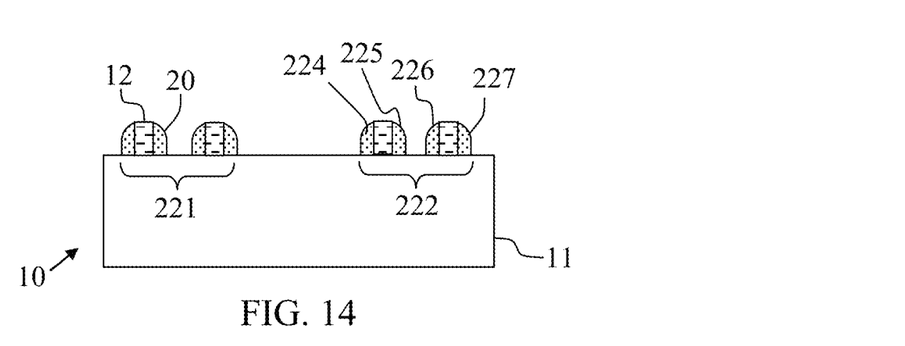

FIGS. 13-14 illustrate the method for fabricating an integrated circuit 10 utilizing a different layout of sacrificial mandrel structures 12. The processing in FIGS. 13-14 is identical to that of FIGS. 1-2 but performed with a different layout. In FIG. 13, the sacrificial mandrel structures 12 have uniform widths but are not uniformly spaced from one another. Further, the sacrificial mandrel structures 12 are not spaced from one another by a distance equal to the mandrel widths. The distance between sacrificial mandrel structures 12 is selected and controlled to provide the desired memory structures as described below. In an exemplary embodiment, the sacrificial mandrel structures 12 have a width 13 and the sacrificial mandrel structures 12 are formed with a spacing 141 or 142.

In FIG. 14, in an exemplary embodiment, a spacer-forming layer is deposited over the sacrificial mandrel structures 12 and is etched to form spacers 20. The spacer-forming layer may be formed via the blanket deposition of silicon nitride, silicon oxide, or another dielectric material. In an embodiment, the spacer-forming layer is masked and an anisotropic or directional etch is performed to remove selected regions of spacer-forming layer and to create spacers 20 adjacent opposing sides of each sacrificial mandrel structure 12. Spacers 20 are formed within groups 221 or 222 of spacers 20. For example, spacers 224, 225, 226 and 227 are formed nearest one another and within group 222 of spacers 20. Thus, spacers 224, 225, 226 and 227 are grouped. The illustrated groups 221 and 222 each include four spacers (for forming four fins of one cell).

Processing of the partially fabricating integrated circuit 10 of FIG. 14 may continue as described in FIG. 3-4 and 5-6 or 7-8 above.

The processing described above provides for formation of MRAM bitcells without any fin cut process within the cell array for cell size optimization/reduction. As a result, space redundancy is significantly reduced, as no fin cut process is needed to avoid source/drain epitaxial merging between fins in different cells.

Further, the processing provides the capability of tuning the inter-cell fin-to-fin spacing for the MRAM bitcells, as well as for larger than standard CMOS fin spacing (intra-cell spacing). This is achieved through the MRAM-dedicated fin patterning process. As described, each bitcell can be formed with multiple fins and transistor gates. Further, due to the dedicated source line architecture, the parallel source line and bitline allow for simultaneous write of 0 and 1. Structurally, the source line are placed in an inter-cell space while the MTJ structure is located above the merged fins of the same cell array, and the bitline is located above the MTJ and the fins of the same cell array. This design enables very competitive bitcell size.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method comprising:
    double patterning a semiconductor substrate to form semiconductor fin structures, wherein the semiconductor fin structures are formed in groups with an intra-group pitch between grouped semiconductor fin structures and with an inter-group spacing between adjacent groups of semiconductor fin structures different from the intra-group pitch;
    forming a semiconductor material over the semiconductor fin structures, wherein the semiconductor material is merged over each group of semiconductor fin structures with the intra-group pitch to define a source/drain region, and the semiconductor material is unmerged between the adjacent groups of semiconductor fin structures with the inter-group spacing;
    forming a first magnetic random access memory (MRAM) memory structure over the semiconductor fin structures in a first bitcell and forming a second magnetic random access memory (MRAM) memory structure over the semiconductor fin structures in a second bitcell; and
    forming a source line for the first bitcell between the first MRAM memory structure and the second MRAM memory structure,
    wherein the grouped semiconductor fin structures are formed without a fin cut process to provide the inter-group spacing such that an empty space free of fins is located between the adjacent groups of semiconductor fin structures with the inter-group spacing.

2. The method of claim 1 further comprising:
forming a bit line over the first MRAM memory structure, wherein the bit line is substantially parallel to the source line.

3. The method of claim 1 further comprising:
forming a plurality of word lines that extend perpendicular to the source line.

4. The method of claim 1 further comprising:
forming a bit line over the first MRAM memory structure and parallel to the source line; and
forming word lines perpendicular to the source line.

5. The method of claim 1 further comprising:
forming a bit line over the first MRAM memory structure and parallel to the source line; and
forming a first word line, a second word line, and a third word line that extend perpendicular to the source line, wherein the first bitcell extends from the first word line, over the second word line, to the third word line.

6. The method of claim 1 further comprising:
forming a bit line over the first MRAM memory structure and parallel to the source line, wherein the first bitcell includes the bit line and the source line; and
forming a plurality of word lines that extend perpendicular to the source line.

* * * * *